United States Patent [19]

Giles et al.

[11] Patent Number: 5,260,513
[45] Date of Patent: Nov. 9, 1993

[54] METHOD FOR ABSORBING RADIATION

[75] Inventors: Robert H. Giles, Upton; Thomas M. Horgan, Tewskbury, both of Mass.

[73] Assignee: University of Massachusetts Lowell, Lowell, Mass.

[21] Appl. No.: 879,962

[22] Filed: May 6, 1992

[51] Int. Cl.$^5$ .................. H05K 9/00; C04B 35/00
[52] U.S. Cl. ..................... 174/35 MS; 361/816; 264/104; 264/105; 174/35 R
[58] Field of Search ............ 428/446, 337, 339; 174/35 R, 35 MS; 361/424; 219/105.5 R, 10.55 D, 10.55 M, 10.41; 29/851, 852, 853, 883, 884; 264/104, 105

[56] References Cited

U.S. PATENT DOCUMENTS

| | | | |
|---|---|---|---|
| 3,680,107 | 7/1972 | Meinke et al. | 342/1 |
| 3,836,967 | 9/1974 | Wright | 342/4 |
| 3,887,920 | 6/1975 | Wright et al. | 342/1 |
| 4,006,479 | 2/1977 | LaCombe | 342/1 |
| 4,023,174 | 5/1977 | Wright | 342/4 |
| 4,024,318 | 5/1977 | Forster et al. | 342/1 |
| 4,164,718 | 8/1979 | Iwasaki | 342/4 |
| 4,173,018 | 10/1979 | Dawson et al. | 342/1 |
| 4,353,069 | 10/1982 | Handel et al. | 342/1 |
| 4,372,246 | 2/1983 | Azar et al. | 427/410 |
| 4,496,950 | 1/1985 | Hemming et al. | 342/4 |
| 4,539,433 | 9/1985 | Ishino et al. | 342/1 |
| 4,942,402 | 7/1990 | Prewer et al. | 342/1 |

FOREIGN PATENT DOCUMENTS

WO91/20179 12/1991 World Int. Prop. O. .

OTHER PUBLICATIONS

"Submillimeter and Millimeter Wave Characterization of Absorbing Materials," by Hamid Hemmati et al., Applied Optics, vol. 24, No. 24, Dec. 15, 1985, pp. 4489-44.

Primary Examiner—Leo P. Picard
Assistant Examiner—Bot Ledynh
Attorney, Agent, or Firm—Hamilton, Brook, Smith & Reynolds

[57] ABSTRACT

A silicone based wedged surface radar absorbing structure operating at terahertz frequencies. The radar absorbing structure includes a silicone based elastomer loaded with iron oxide and formed with a wedged type surface geometry consisting of a plurality of grooves having small groove angles in the range of about 22.5°.

5 Claims, 3 Drawing Sheets transceiver's look direction

METHOD FOR ABSORBING RADIATION

GOVERNMENT SUPPORT

This invention was made with Government support under Contract No. MDA908-86-C-4321 awarded by the Department of the Army. The Government has certain rights in this invention.

BACKGROUND OF THE INVENTION

This invention relates generally to materials that suppress unwanted stray radiation.

Typically, anechoic materials are used to absorb and dissipate radiant energy. Such materials are suitable for shielding objects from radiated energy in astronomical telescopes, and satellites, among other terahertz frequency applications.

The ability of conventional radiation absorber materials (RAMs) to absorb radiated energy and reduce reflectivity is dependent upon the geometry and composition of the material. Various shapes, sizes and compositions, have been disclosed but are generally not suitable for use with radiation energy in the gigahertz and terahertz frequency range or are too difficult to manufacture economically in reasonable volume.

SUMMARY OF THE INVENTION

A radiation absorber material designed to operate in the terahertz frequency range is disclosed in U.S. Pat. No. 4,942,402, issued to Prewer et al. This radiation absorber is formed from a cured silicone based elastomer containing an inert powdered siliceous filler. Both the elastomer and the filler are electrically insulating. The surface of this absorber is profiled with a plurality of pyramids to enhance the absorption of incident radiation.

There are several disadvantages associated with the material disclosed in Prewer et al. One disadvantage is that there are high costs associated with manufacturing this material. Another problem is that the manufacturing yield has been limited to a material that has a relatively small area in the order of 36 in$^2$. Furthermore, production of this material has been plagued with a high loss ratio during the molding of the pyramidal surface profile. The imperfections arising from the high loss ratio appear to be caused by air trapped in the mold and mold adhesion. Thus, there is a need for a radiation absorbing material that can be manufactured without having air traps and adhesion problems.

The present invention provides a radiation absorbing structure that is easily moldable or machinable and provides better reflectivity and transmissivity properties at terahertz frequencies.

In accordance with a preferred embodiment of the present invention, there is provided an anechoic structure for absorbing radiation at terahertz frequencies ranging from about 0.3 THz to about 3 THz. The anechoic structure is formed from a low front surface reflection material and an electrically conductive filler. The base material which provides low front surface reflection properties is preferably a silicone based elastomer. To minimize transmission through the material, an electrically conductive filler is introduced as a lossy media, preferably iron oxide. The elastomer is profiled with a wedge shaped surface geometry structure to enhance the low reflectivity properties of the base material. The wedge shaped surface geometry structure comprises a plurality of wedges each having a groove angle ($\theta g$) and a radius ($R_p$ and $R_v$) for minimizing reflectivity of the radiation. The preferred groove angle, $\theta g$, is about 22.5° and the preferred maximum radius for each wedge peak $R_p$ is about 0.005 inch and each wedge valley $R_v$ is 0.001 inch.

In another preferred embodiment of the present invention, the radar absorbing structure is placed on the walls, floor, and ceiling of a laboratory to form an anechoic chamber for absorbing radiation operating in the terahertz frequency range. A terahertz source and detector are placed in the anechoic chamber to measure its reflectivity and transmissivity.

The present invention further includes a preferred method of absorbing radiation operating at terahertz frequencies. First, a silicone based elastomer is provided. Then, an iron oxide filler is loaded into the elastomer for providing low front surface reflectivity and transmissivity. The elastomer is then shaped to have a plurality of wedges each having a groove angle therein. Finally, the elastomer is cured with peroxide.

While the present invention will hereinafter b described in connection with a preferred embodiment and method of use, it will be understood that it is not intended to limit the invention to this embodiment. Instead, it is intended to cover all alternatives, modifications and equivalents, as may be included within the spirit and scope of the invention as defined by the appended claims.

DETAILED DESCRIPTION OF THE INVENTION

Figure 1:
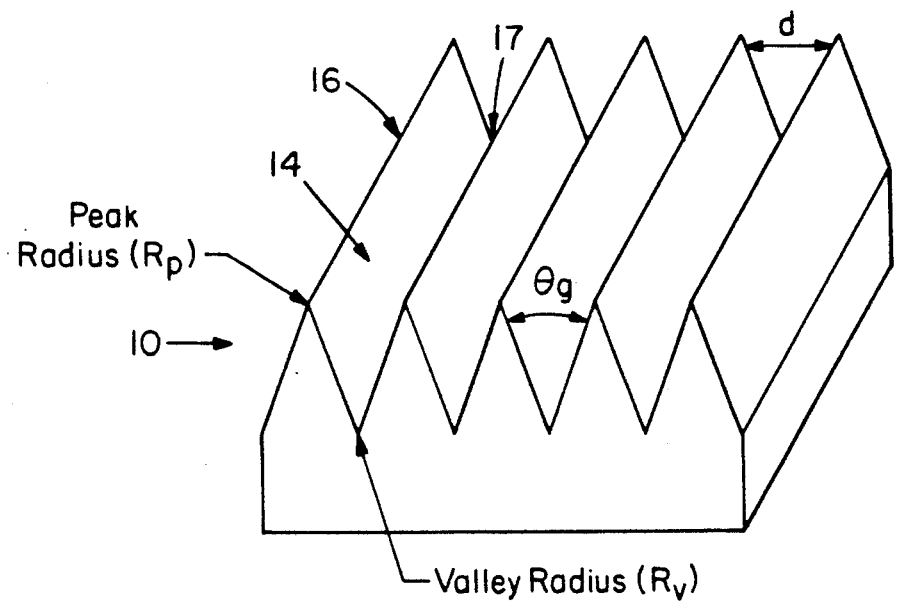
FIG. 1 is a perspective view of the radiation absorbing structure embodied in the present invention.

A perspective view of a radiation absorbing structure incorporating the features of the present invention is shown in FIG. 1 and is designated by reference numeral 10. The radiation absorbing structure 10 is made from a silicone based elastomer having a plurality of wedges 4 formed therein. Each wedge has a groove angle $\theta_g$ with radii $R_p$ and $R_v$. Radiation incident to the wedges is subject to multiple reflections, which effectuates absorption. To further optimize absorption and reduce scattered radiation, the plurality of wedges are formed with sharp peaks 16 and valleys 17 and minimized radii. If the peaks and valleys are rounded, there will be more scattered radiation that is not absorbed by the structure 10.

To absorb an optimal amount of incident radiation, it is necessary that the radiation absorbing structure have a low reflectivity and transmissivity. Reflectivity is the ratio of energy carried by a wave which is reflected from a surface to the energy carried by the wave which is incident on the surface and transmissivity is the radiant energy transmitted by a body.

The reflectivity ($R_s$) of the radiation absorbing structure 10 is expressed by the following equation:

$$R_s \approx R_f^{(180°/\theta g)}$$

wherein $R_f$ is the front surface reflectivity. This equation indicates that the reflectivity ($R_s$) of the radiation absorbing structure decreases exponentially with a decreasing groove angle $\theta_g$. The number of reflections that the radiation is subjected to is dependent upon $\theta_g$. If the groove angle is set high there is more scattered radiation with less being absorbed. A large groove angle simplifies the manufacturing process, but lowers the front surface reflectivity, If the groove angle is small, there is less scattered radiation with more being absorbed. Small groove angle structures are difficult to manufacture, but result in a radiation absorbing structure having low front surface reflectivity. The preferred groove angle $\theta_g$ for the present invention is about 22.5°.

To further reduce the low front surface reflectivity of the radiation absorbing structure, an electrically conductive filler is loaded into the silicone-based elastomer. The electrically conductive filler with the silicone-based elastomer is cured with peroxide to form a lossy dielectric material exhibiting a low front surface reflectivity (less than 10%). The preferred conductive filler is iron oxide ($FeO_2$) which causes the structure to have a red color. Other metallic oxides or conductive media such as Titanium Oxide ($TiO_2$) may be loaded to the silicone-based elastomer. A radiation absorbing structure loaded with $TiO_2$ would have a yellow color. However, the electrical properties for an absorbing structure loaded with $TiO_2$ would be the same as in an $FeO_2$ loaded structure.

Figure 2A:
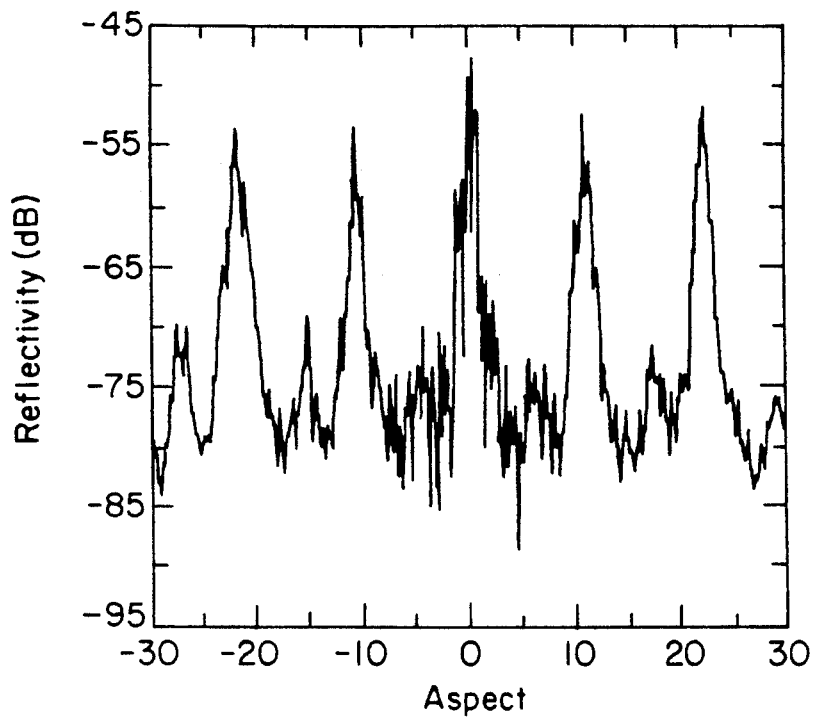
FIGS. 2a–2c represent the measured reflectivity of the radiation absorbing structure versus an aspect angle for several depression angles.
Figure 2B:
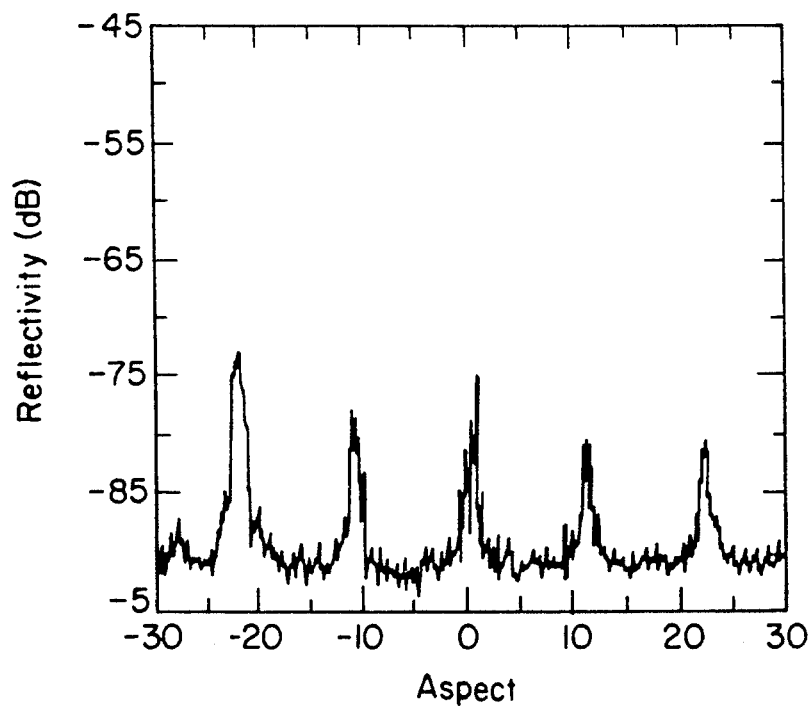
Figure 2C:
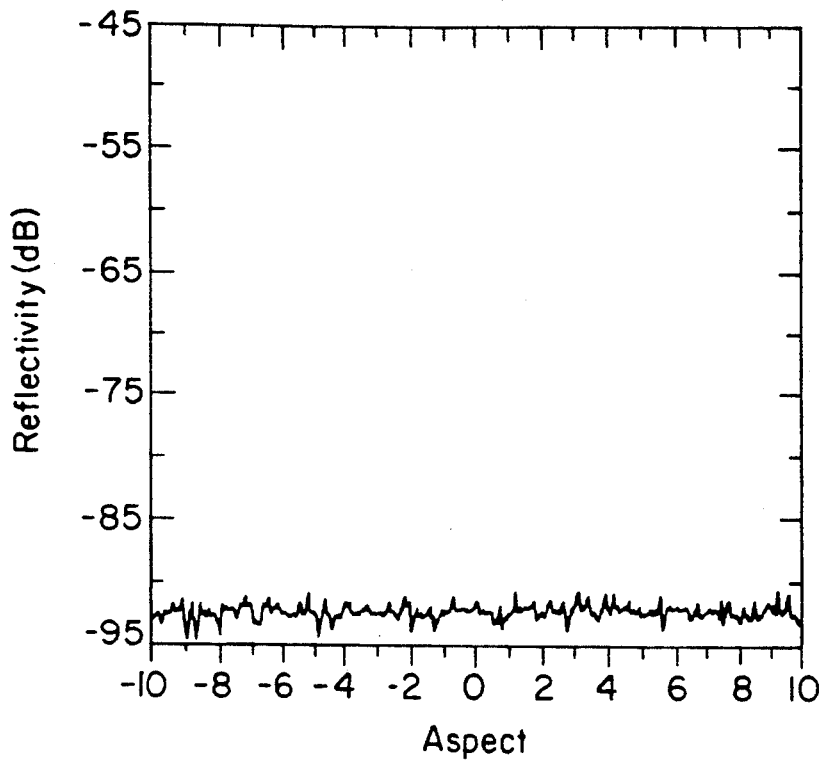

An iron oxide filler with silicone-based elastomer provides a front surface reflectivity ($R_f$) that is less than 5%, and provides a reflection loss that is greater than $-60$ db for incident frequencies in the terahertz range of about 0.3 terahertz to about 3.0 terahertz. FIG. 2a shows the reflectivity of the structure as a function of the aspect angle ($\theta$) with its vertical plane normal to a transceiver's look direction. FIG. 2b-2c shows the reflectivity of the structure as a function of the aspect angle ($\theta$) with its vertical plane at 1° and 5°, respectively, to the look direction.

Figure 2D:
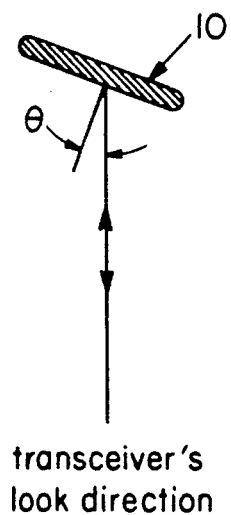
FIG. 2d is a top view depicting the measurement scheme for the plots of FIGS. 2a–2c.

FIG. 2d shows a top view of a measurement scheme for collecting the data presented in FIGS. 2a-2c. In this measurement scheme, reflectivity as a function of an incident angle exhibits reflectivity peaks with its vertical plane being $\pm 2°$ in the look direction. These reflectivity peaks have an angular spread ($\theta$) between two adjacent peaks according to the following equation:

$$\theta = \sin - 1 \frac{\lambda}{2d}$$

wherein $\lambda$ is the wavelength of the radiation and d is the distance between the structural peaks of the anechoic. Once outside the $\pm 2°$ region (typically the orientation for which the material shall be utilized), the reflectivity is greater than $-90$ dB. The structure in Prewer et al. has similar peaks in both angular dimensions. Therefore, no orientation in Prewer et al. exhibits the same ideal performance as depicted in FIG. 2b. In fact, the reflection loss for the structure of the present invention is considerably higher than the reflection loss in the structure provided in Prewer et al ($-45$ dB).

Figure 3:
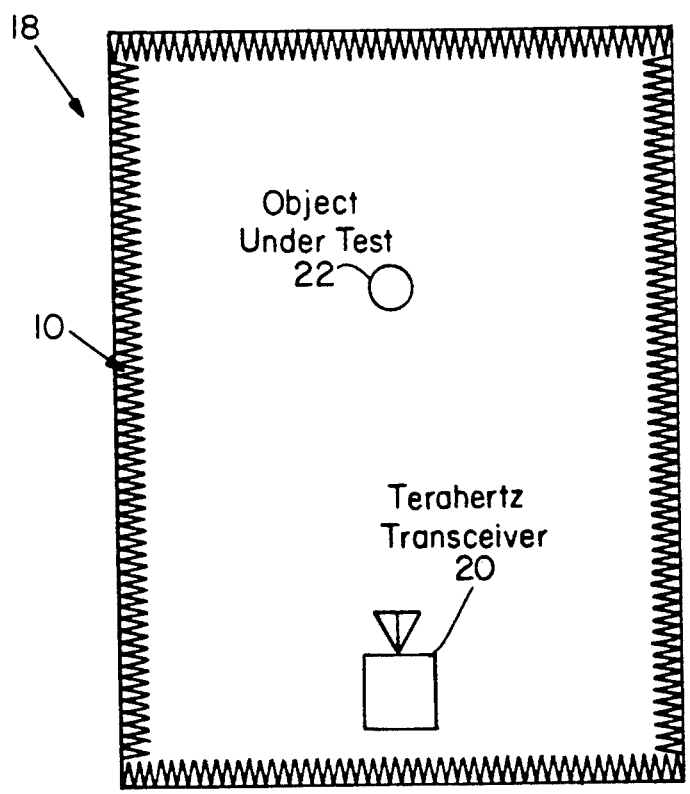
FIG. 3 shows a top view of the radiation absorbing structure embodied in an anechoic chamber.

FIG. 3 shows a top view of the radiation absorbing structure embodied in an anechoic chamber 18. The anechoic chamber includes a walled structure of radiation absorbing structures 10 pieced together. As example to one application, a terahertz transmitter/receiver 20 is placed in the anechoic chamber with an object under test. Radiation incident to the walled structure is subject to multiple reflections. The radiant energy is suppressed and absorbed by the walled structure. Therefore, the receiver 20 provides a measure of radiation directly scattered from the object 22 under test only, and generates a terahertz frequency response with no interaction of the walled structure.

It is apparent that there has been provided in accordance with the present invention, a radiation absorbing structure that suppresses radiation in the terahertz frequency range. The radiation absorbing structure includes a silicone based elastomer material profiled with a wedge type geometry surface facing incident radiation and loaded with an electrically conductive filler.

The elastomer is preferably a silicone, however, the anechoic material could be made from an acrylic or a plastic or a polymer-based material.

Although the profile of the radiation absorbing structure of the present invention has been disclosed with a wedge shape surface geometry, it may be a pyramid.

The above radiation absorbing structure 10 formed by compression molding a 95 oz. load weight and peroxide cured for 10 minutes at 350° F. The mold is bump delayed twice to vent any trapped air and the silicone-base part is finished trimmed to provide a 24"×24" area.

While the invention has been particularly shown in conjunction with the preferred embodiment thereof, it will be understood that many alternatives, modifications and variations will be apparent to those skilled in the art without departing from the spirit and scope of the invention as defined by the appended claims.

We claim:

1. A method for absorbing incident radiation in the terahertz frequency range, including the steps of:
   providing a silicone based elastomer;
   loading an electrically conductive filler into the silicone based elastomer;
   curing the filled silicone based elastomer;
   forming the filled elastomer into a wedge-shaped surface geometry; and
   absorbing incident radiation for frequencies ranging from about 0.3 terahertz to about 3.0 terahertz.

2. A method according to claim 1, wherein the electrically conductive filler is $FeO_2$.

3. A method for absorbing incident radiation at terahertz frequencies, including the steps of:
   providing a silicone elastomer;
   loading an $FeO_2$ filler into the silicone elastomer; and
   curing the loaded elastomer with peroxide;
   forming the loaded elastomer into a groove shaped structure having a plurality of grooves with an angle $\theta_g$ between the grooves wherein each groove is about 22.5°.

4. A method for absorbing radiation in an anechoic chamber, including the steps of:
   placing a test object in the anechoic chamber;
   transmitting radiation in the terahertz frequency range at the test object;
   providing a walled structure of $FeO_2$ loaded silicone elastomers in the anechoic chamber;
   shaping the walled structure with a plurality of grooves each having an angle $\theta_g$ therebetween for absorbing radiation reflected from the test object; and
   measuring reflectivity and transmissivity of the walled structure.

5. A method for absorbing incident radiation in the terahertz frequency range, including the steps of:
   providing a silicone based elastomer;
   loading a titanium oxide filler into the silicone based elastomer; and
   curing and forming the loaded silicone based elastomer into a wedge shaped surface geometry which provides a reflective loss greater than −60 db for incident radiation in frequencies ranging from about 0.3 terahertz to about 3.0 terahertz.

* * * * *